United States Patent
Jung et al.

(10) Patent No.: US 9,726,708 B2
(45) Date of Patent: Aug. 8, 2017

(54) DEVICE FOR DETECTING PARTIAL DISCHARGE FOR POWER TRANSFORMER

(71) Applicant: HYOSUNG CORPORATION, Anyang-si, Gyeonggi-do (KR)

(72) Inventors: Jae-Ryong Jung, Gimhae-si (KR); Eun-Tae Ryu, Changwon-si (KR); Kyung-Rok Hwang, Busan (KR)

(73) Assignee: HYOSUNG CORPORATION, Anyang-si, Gyeonggi-do (KR)

( * ) Notice: Subject to any disclaimer, the term of this patent is extended or adjusted under 35 U.S.C. 154(b) by 409 days.

(21) Appl. No.: 14/368,442

(22) PCT Filed: Dec. 24, 2012

(86) PCT No.: PCT/KR2012/011360
§ 371 (c)(1),
(2) Date: Jun. 24, 2014

(87) PCT Pub. No.: WO2013/100512
PCT Pub. Date: Jul. 4, 2013

(65) Prior Publication Data
US 2014/0347091 A1     Nov. 27, 2014

(30) Foreign Application Priority Data

Dec. 26, 2011  (KR) .......................... 10-2011-0142151

(51) Int. Cl.
| | |
|---|---|
| *G01R 31/12* | (2006.01) |
| *G01R 31/40* | (2014.01) |
| *G01R 31/02* | (2006.01) |
| *G01R 31/14* | (2006.01) |

(52) U.S. Cl.
CPC ....... *G01R 31/1272* (2013.01); *G01R 31/027* (2013.01); *G01R 31/1254* (2013.01); *G01R 31/14* (2013.01); *G01R 31/40* (2013.01)

(58) Field of Classification Search
CPC .............. G01R 31/027; G01R 31/1227; G01R 31/1272; G01R 31/14; G01R 31/16;
(Continued)

(56) References Cited

U.S. PATENT DOCUMENTS 5,075,629 A * 12/1991 Umemura ............... G01R 31/12
324/547
5,272,525 A * 12/1993 Borchardt ............ H04B 1/0096
348/723
(Continued)

FOREIGN PATENT DOCUMENTS

IN          200900353 I3 * 10/2010 ............. G01R 31/12
KR    10-2001-0012722 A    2/2001
(Continued)

OTHER PUBLICATIONS

English Machine Translation of foreign patent document T. Choi, KR 10-2011-0075681, Jul. 6, 2011.*

*Primary Examiner* — Tung X Nguyen
*Assistant Examiner* — Lee Rodak
(74) *Attorney, Agent, or Firm* — Novick, Kim & Lee, PLLC; Jae Youn Kim

(57) ABSTRACT

The present invention relates to a device for detecting a partial discharge for a power transformer which detects an electromagnetic signal occurring due to faulty insulation. The device includes an antenna unit receiving electromagnetic waves, an insulator including the antenna unit, a metallic air-tight unit that seals a connector connected to the insulator and connecting a coaxial cable, and the coaxial cable exposed to the outside of the metallic air-tight unit. Thus, it is possible to enhance broadband properties through an internal conductor of a drain valve.

5 Claims, 3 Drawing Sheets

(58) Field of Classification Search
CPC ............ G01R 31/1254; G01R 31/1263; G01R 31/40; G01R 31/06; G01R 31/346; G01R 31/1245; G01R 31/333; G01R 27/2617; H01F 27/402; H01F 27/365; H01F 2027/404; H01F 38/00; H01H 9/50; H02H 7/04
USPC .......... 324/764.01, 536, 547, 122, 546, 551, 324/512, 515, 522, 500, 520, 537, 552, 324/553; 340/635, 646, 647
See application file for complete search history.

(56) References Cited

U.S. PATENT DOCUMENTS

| | | | | |
|---|---|---|---|---|
| 6,323,655 | B1* | 11/2001 | Fu ........................ | H01F 27/402 |
| | | | | 324/536 |
| 6,774,639 | B1* | 8/2004 | Unsworth .............. | H01H 33/26 |
| | | | | 324/535 |
| 2004/0046568 | A1* | 3/2004 | Unsworth .......... | G01R 31/1209 |
| | | | | 324/536 |
| 2006/0145705 | A1* | 7/2006 | Raja ..................... | G01R 31/16 |
| | | | | 324/536 |
| 2007/0139056 | A1* | 6/2007 | Kaneiwa ............ | G01R 31/1227 |
| | | | | 324/536 |

FOREIGN PATENT DOCUMENTS

| | | | | |
|---|---|---|---|---|
| KR | 10-2008-0004375 A | | 1/2008 | |
| KR | 10-2011-0075681 | * | 6/2011 | ............ G01R 31/12 |
| KR | 10-2011-0075681 A | | 7/2011 | |

* cited by examiner

DEVICE FOR DETECTING PARTIAL DISCHARGE FOR POWER TRANSFORMER

TECHNICAL FIELD

The present invention relates to a device for detecting partial discharge for a power transformer that detects partially discharged electromagnetic wave signals caused by faulty insulation.

BACKGROUND ART

A general partial discharge detecting device for a power transformer is disposed within electric power equipment while maintaining a predetermined insulating distance, and detects partially discharged signals.

When the partial discharge detecting device is disposed within a drain valve of the power transformer, the partial discharge detecting device does not additionally include a separate inspection window, and sensors can be arranged at various locations.

FIG. 1 illustrates a partial discharge detecting device according to the related art.

Referring to FIG. 1, a partial discharge detecting device according to the related art is disposed within a drain valve.

The partial discharge detecting device 10 is separately provided with a signal input end 11 and a signal output end 13. The partial discharge detecting device 10 detects partially discharged signals with receiving units 12a and 12b, in which the receiving units 12a and 12b are connected to the input end and the output end, respectively, in the form of a parallel coupler.

Although a frequency band of signals generated during partial discharge corresponds to a wideband, the partial discharge detecting device generally detects signals in the frequency band of 0.3 to 1.5 GHz of the Ultra High Frequency (UHF) band (0.3~3 GHz) less affected by noise. In order to receive signals of the wide UHF band, wideband properties are required. It is impossible to have a wideband through a single shape and an identical shape since a wavelength is physically restricted, and therefore, it is necessary to design a receiving unit having several wavelengths.

DETAILED DESCRIPTION OF THE INVENTION

Technical Problem

An aspect of the present invention is to provide a partial discharge detecting device for a power transformer that can detect partially discharged signals, which are the result of an abnormality in the power transformer, through multiple sub-bands.

Technical Solution

In accordance with one aspect of the present invention, a device for detecting partial discharge for a power transformer is provided. The device includes: an antenna unit receiving an electromagnetic wave; an insulating sealing unit including the antenna unit and protecting a coaxial cable; a metal sealing unit connected with the insulating sealing unit and a metal handle; the metal handle sealing a connector connecting the metal sealing unit and the coaxial cable; and the coaxial cable extracted to an outside of the metal sealing unit.

The insulating sealing unit cover from the antenna unit to a contact part of an internal conductor of a drain valve.

The sum of a length of the insulating sealing unit and a length of the metal sealing unit may be proportional to a wavelength for a resonant frequency, the length of the insulating sealing unit obtained by subtracting a length of the antenna unit from a length of the drain valve.

The antenna unit may receive division frequencies configured with a plurality of divided signal bands of a received frequency band for detecting partial discharge signals of the power transformer.

The device may further include a measuring unit connected through the coaxial cable and measuring the electromagnetic waves received by the antenna unit.

Advantageous Effects

As described above, according to the present invention, the partial discharge detecting device can receive signals in a wide range of frequency bands through multiple sub-bands.

Furthermore, according to the present invention, the partial discharge detecting device can detect signals of a frequency band having a different wavelength for each of multiple sub-bands.

In addition, according to the present invention, performance of an antenna can be improved using characteristics of an internal conductor of a drain valve to which an antenna is attached.

MODE FOR CARRYING OUT THE INVENTION

Hereinafter, an embodiment of the present invention will be described in detail with reference to the accompanying drawings.

The embodiment of the present invention relates to a system for diagnosing a power transformer by detecting partially discharged signals of the Ultra High Frequency (UHF) band.

An antenna unit included within a drain valve is sealed by an insulating sealing unit. According to the sum of a length of the drain valve but excluding the antenna unit and a length of a conductor boundary by a metal sealing unit, a bandwidth of the antenna is increased by periodic resonance of the antenna unit, which is sealed with the insulating sealing unit, by an E-field distribution within the valve.

Figure 1:
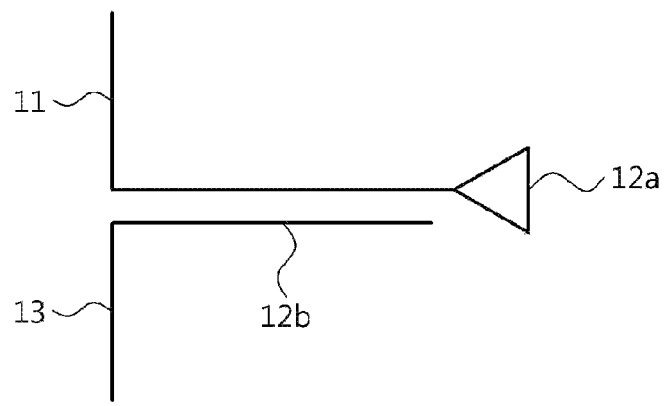
FIG. 1 illustrates a partial discharge detecting device according to the related art.
Figure 2:
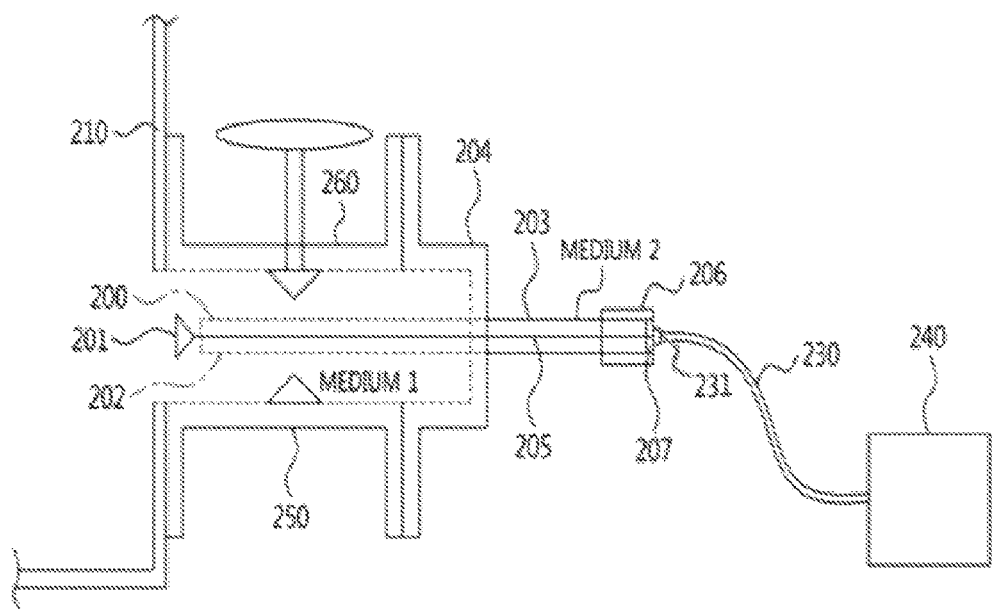
FIG. 2 is a longitudinal sectional view of a partial discharge detecting device according to an embodiment of the present invention.

FIG. 2 is a longitudinal sectional view of a partial discharge detecting device according to an embodiment of the present invention.

Referring to FIG. 2, a partial discharge detecting device 200 may be disposed in a drain valve 260 at an upper or lower portion of a power transformer 210.

The partial discharge detecting device 200 may operate in conjunction with a partial discharge signal processing device 240 through an N-type connector 220 and a coaxial cable 230.

In order to detect partial discharge signals in an Ultra High Frequency (UHF) band of 0.5 to 1.5 GHz occurring in the power transformer, the partial discharge detecting device 200 may include an antenna unit 201 for detecting signals in multiple sub-bands.

The antenna unit 201 of the partial discharge detecting device 200 may have different wavelengths for the respective multiple sub-bands of the partial discharge signal band (e.g., four frequency bands: a first frequency band of 0.5 to 0.75 GHz, a second frequency band of 0.75 to 1.00 GHz, a third frequency band of 1.00 to 1.25 GHz, and a fourth frequency band of 1.25 to 1.5 GHz).

The antenna unit 201 receives division frequencies configured with a plurality of divided signal bands for detecting the partial discharge signals of the power transformer among frequency bands.

Figure 4:
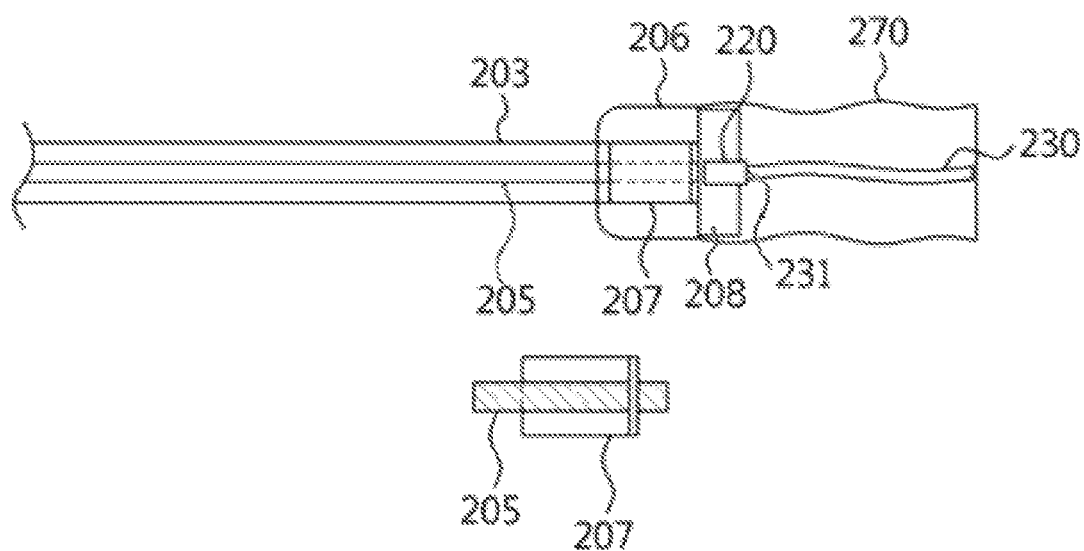
FIG. 4 is a detailed view of the ground structure and the metal handle illustrated in FIG. 2.

The antenna unit 201 of the partial discharge detecting device 200 may detect an electromagnetic wave caused by the partial discharge. The detected electromagnetic wave may be transmitted to the measuring device 240 through an insulator 202 including the antenna unit 201, a metal sealing unit 203, a metal handle 206, and the coaxial cable 230. At this time, a specific structure of a ground unit 207 and the metal handle 206 is the same as illustrated in FIG. 4.

The measuring device 240 is connected with the partial discharge detecting device 200 through the coaxial cable 230, and measures intensity of the electromagnetic wave detected by the antenna unit 201. Based on the measurement result, the measuring device 240 may determine whether the partial discharge occurs within the power transformer 210.

A resonant frequency and a bandwidth of the antenna unit 201 may be determined depending on the size thereof. Furthermore, the resonant frequency and the bandwidth may be determined depending on the sum of a length of an internal conductor of a drain valve 260 and 250 to which the insulating sealing unit 202 other than the antenna unit 201 is attached and a length of a conductor boundary by the metal sealing unit.

The insulating sealing unit 202 may be configured in the form of an airtight container such as a pipe to include the antenna unit 201. The insulating sealing unit 202 includes the antenna unit 201. The insulating sealing unit may be configured to extend to a contact surface of the internal conductor of the drain valve 260 and 250. The bandwidth of the resonant frequency and the wavelength may be proportional depending on the length of the internal conductor of the drain valve 260 and 250 corresponding to the length of the insulating sealing unit 202 other than the antenna unit 201 and the length of the conductor boundary by the metal sealing unit.

Referring to FIG. 2, the partial discharge detecting device 200 for the power transformer may include a flange 204 in a single tube form such that the large-sized antenna unit 201 may also be attached to the drain valve 250 and 260.

That is, a sensor is attached to the power transformer while the drain valve is closed to prevent insulating oil from leaking. At this time, a space between the drain valve and the flange is narrow, and therefore, the antenna may have a limitation in size to be attached between the drain valve and the flange. In order to solve the above-described problem, the flange is made in the single tube form, thereby increasing the space between the drain valve and the flange to make the antenna unit larger.

Referring to FIGS. 2 and 4, the partial discharge detecting device 200 may include a structure (a ground unit 207) for spacing a shield line 231 of an antenna cable 205 apart from the conductive pipe 203 to maintain an insulating distance by an insulating support rod 208 and grounding the shield line 231 and the conductive pipe at the end portion of the conductive pipe for a distribution of E-field within the drain valve and the conductive pipe.

Furthermore, the partial discharge detecting device 200 may include the metal handle 206 that seals the connector connecting the metal sealing unit 203 and the coaxial cable 230 and is covered with a waterproof tube 270 to enable the regular measurement.

That is, the metal handle 206 is a structure for sealing the connector 220 connecting the metal sealing unit 203 and the coaxial cable 230. When the cap of the metal handle 206 is removed, a connection with the coaxial cable 230 may be made, and when the handle 206 is covered with the waterproof tube 270, the regular measurement may be carried out.

Figure 3:
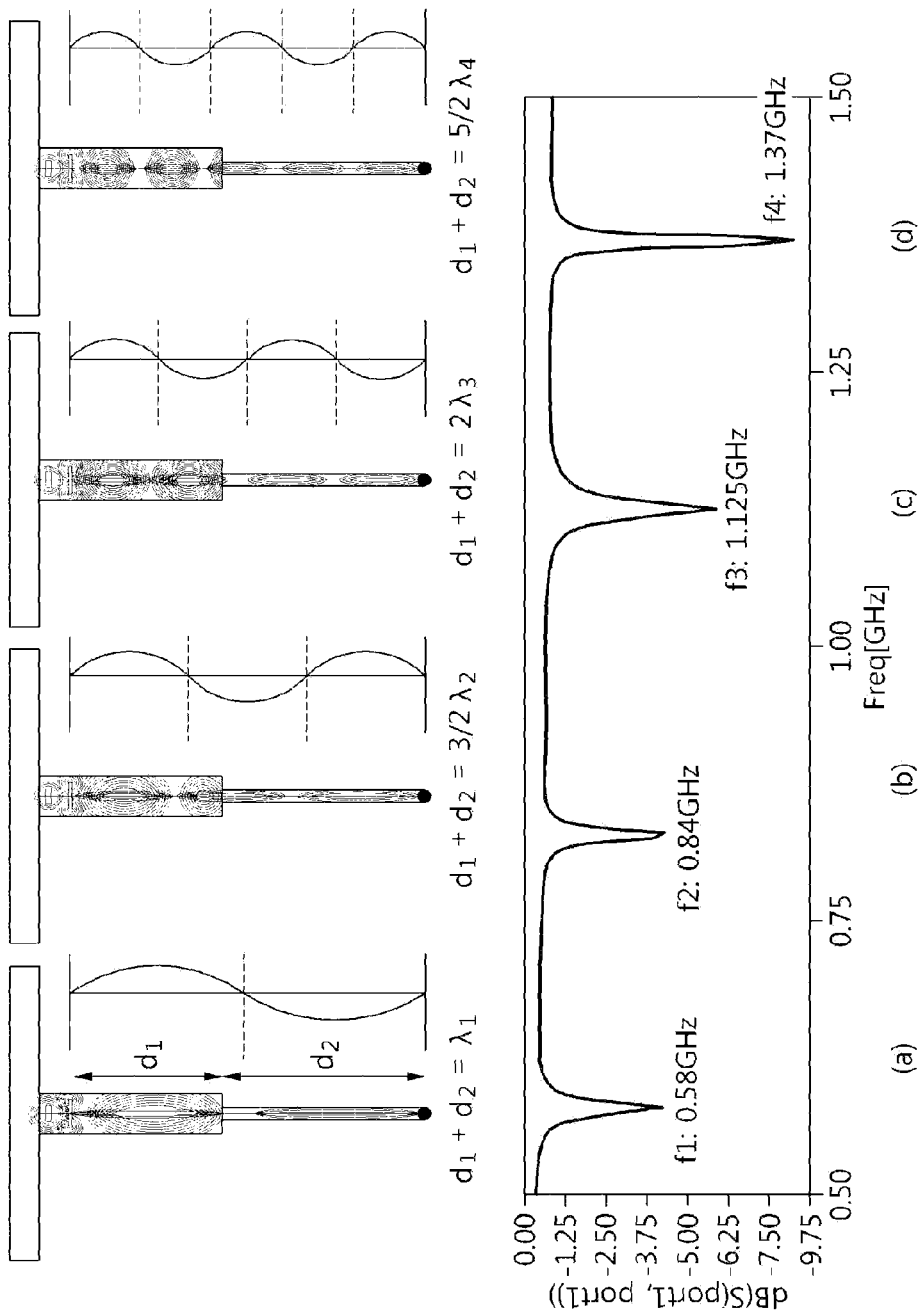
FIG. 3 illustrates an example for explaining a resonant frequency and an equivalent wavelength depending on an antenna in a partial discharge detecting device according to an embodiment of the present invention.

FIG. 3 illustrates an example for explaining a resonant frequency and an equivalent wavelength depending on an antenna in a partial discharge detecting device according to an embodiment of the present invention.

(A) to (D) of FIG. 3 represent wavelengths ($\lambda$) eof the sum of the length of the insulating sealing unit 202 but excluding the antenna unit 201 and the length of the metal sealing unit 203 according to a resonant frequency (f). That is, (A) to (D) of FIG. 3 represent the wavelengths ($\lambda$) when a predetermined length (d1) of a total length (d1+d2) of the insulating sealing unit 202 and the metal sealing unit 203 other than the length of the antenna unit 201 is included in the insulating sealing unit 202. Namely, the length d1 of the insulating pipe (the insulating sealing unit) may be determined as "the length of the drain valve–the length of the antenna unit (effective length)". At this time, d2 is the length of the conductive pipe (the metal sealing unit).

In (A) of FIG. 3, when the predetermined length (d1) of the total length (d1+d2) of the insulating sealing unit 202 and the metal sealing unit 203 other than the length of the antenna unit 201 is included in the insulating sealing unit 202, a wavelength may be identical to the length of d1+d2 for a resonant frequency f1 of 0.58 GHz.

In (B) of FIG. 3, when the predetermined length (d1) of the total length (d1+d2) of the insulating sealing unit 202 and the metal sealing unit 203 other than the length of the antenna unit 201 is included in the insulating sealing unit 202, a wavelength may be 1.5 times longer than the length of d1+d2 for a resonant frequency f2 of 0.84 GHz.

In (C) of FIG. 3, when the predetermined length (d1) of the total length (d1+d2) of the insulating sealing unit 202 and the metal sealing unit 203 other than the length of the antenna unit 201 is included in the insulating sealing unit 202, a wavelength may be 2 times longer than the length of d1+d2 for a resonant frequency f3 of 1.125 GHz.

In (D) of FIG. 3, when the predetermined length (d1) of the total length (d1+d2) of the insulating sealing unit 202 and the metal sealing unit 203 other than the length of the antenna unit 201 is included in the insulating sealing unit 202, a wavelength may be 2.5 times longer than the length of d1+d2 for a resonant frequency f4 of 1.37 GHz.

A phase by the length d1 and a phase by the length d2 satisfy "Phase by d1+Phase by d2=$2\pi$". At this time, the phase by the length d1 may be defined as $\beta_1 d_1$ ($\beta_1$: propagation constant of medium 1 in the drain valve 250, 260), and the phase by the length d2 may be defined as $\beta_2 d_2$ ($\beta_2$: propagation constant of medium 2 in the metal sealing unit 203). The length of d2 (the conductive sealing unit) satisfying the condition "β1d1+β2d2=2π" may be defined by the following equation.

$$d2=1/\beta2(2\pi-\beta1d1) \quad \text{Equation 5}$$

Accordingly, as described above, according to the present invention, when the antenna unit 201 is included in the insulating sealing unit 202 by the predetermined length, properties of the wideband frequency can be improved.

Although the present invention has been described by the restricted embodiments and the drawings as described above, the present invention is not limited to the above-described embodiments and various modifications and alterations can be made from the descriptions by those skilled in the art to which the present invention pertains.

Accordingly, the scope of the present invention should not be determined by the above-described embodiments, and should be determined by not only the following claims but also their equivalents.

The invention claimed is:

1. A device for detecting partial discharge for a power transformer, comprising:
    an antenna unit receiving an electromagnetic wave;
    an insulating sealing unit disposed in a drain valve and comprising the antenna unit and protecting an antenna cable;
    a metal sealing unit connected with the insulating sealing unit and a metal handle;
    the metal handle sealing a connector connecting the metal sealing unit and a coaxial cable; and
    the coaxial cable extracted to an outside of the metal sealing unit,
    wherein a shield line of the antenna cable connecting the coaxial cable and the connector of the metal handle contacts the metal handle which is an end portion of the metal sealing unit,
    wherein the device further comprises a flange, in a single tube form, attached to the drain valve to enable a space between the drain valve and the flange to be increased,
    wherein the metal handle seals the connector connecting the metal sealing unit and the coaxial cable and is covered with a waterproof tube to enable a regular measurement, and
    wherein a length (d2) of the metal sealing unit is adjusted such that a total length (d1+d2) of the length of insulating sealing unit (d1) and the length of the metal sealing unit (d2) is proportional to a wavelength for a resonant frequency, when a phase of the wave by the length (d1) is defined as β1×d1 and the phase of the wave by the length (d2) is defined as β2×d2, the length (d2) is defined by the following equation: d2=1/β2(2π−β1d1), wherein β1 is a propagation constant of a first medium which is contained in the drain valve and β2 is a propagation constant of a second medium which is contained in the metal sealing unit.

2. The device of claim 1, wherein the insulating sealing unit connects the antenna unit to a contact part of an internal conductor of the drain valve.

3. The device of claim 1, wherein the antenna unit receives division frequencies configured with a plurality of divided signal bands for detecting partial discharge signals of the power transformer among frequency bands.

4. The device of claim 1, further comprising:
    a measuring unit connected to the connector through the coaxial cable, and measuring the electromagnetic wave received by the antenna unit.

5. The device of claim 1, further comprising:
    an insulating support rod for maintaining the coaxial cable connecting the antenna unit and the connector of the metal handle at a center of the insulating sealing unit and the metal sealing unit.

* * * * *